United States Patent
Halford et al.

(10) Patent No.: US 8,259,868 B1
(45) Date of Patent: Sep. 4, 2012

(54) CONDITIONALLY CYCLE-FREE GENERALIZED TANNER GRAPHS BASED DECODING

(75) Inventors: Thomas R. Halford, West Hollywood, CA (US); Keith M. Chugg, La Canada Flintridge, CA (US)

(73) Assignee: University of Southern California, Los Angeles, CA (US)

( * ) Notice: Subject to any disclaimer, the term of this patent is extended or adjusted under 35 U.S.C. 154(b) by 819 days.

(21) Appl. No.: 12/238,425

(22) Filed: Sep. 25, 2008

Related U.S. Application Data

(60) Provisional application No. 60/975,141, filed on Sep. 25, 2007.

(51) Int. Cl.
*H03D 1/00* (2006.01)

(52) U.S. Cl. ........ 375/341; 375/340; 375/316; 714/780; 714/786; 714/792; 714/795; 714/755; 714/758

(58) Field of Classification Search .................. 375/316, 375/340
See application file for complete search history.

(56) References Cited

U.S. PATENT DOCUMENTS

| | | | |
|---|---|---|---|
| 4,853,930 A | 8/1989 | Shimada | |
| 5,014,276 A | 5/1991 | Bush et al. | |
| 5,233,349 A | 8/1993 | Moulsley | |
| 5,930,272 A | 7/1999 | Thesling | |
| 5,933,462 A | 8/1999 | Viterbi et al. | |
| 6,233,290 B1 | 5/2001 | Raphaeli | |
| 6,304,996 B1 | 10/2001 | Van Stralen et al. | |
| 6,343,103 B1 | 1/2002 | Lou et al. | |
| 6,351,832 B1 * | 2/2002 | Wei | 714/701 |
| 6,484,283 B2 | 11/2002 | Stephen et al. | |
| 6,507,927 B1 | 1/2003 | Kalliojarvi et al. | |
| 6,769,007 B2 | 7/2004 | Sutherland et al. | |
| 6,810,502 B2 * | 10/2004 | Eidson et al. | 714/786 |
| 6,990,626 B2 | 1/2006 | Ashikhmin | |
| 7,197,691 B2 | 3/2007 | Beerel et al. | |
| 2002/0021770 A1 | 2/2002 | Beerel et al. | |
| 2002/0168017 A1 * | 11/2002 | Berthet et al. | 375/267 |
| 2003/0106012 A1 * | 6/2003 | Hewitt | 714/780 |
| 2004/0237025 A1 * | 11/2004 | Beerel et al. | 714/796 |
| 2004/0261002 A1 * | 12/2004 | Eidson et al. | 714/786 |
| 2008/0072123 A1 * | 3/2008 | Eidson et al. | 714/786 |
| 2008/0142129 A1 * | 6/2008 | Reasner et al. | 150/131 |

OTHER PUBLICATIONS

Thomas Halford, Keith Chugg, "The tradeoff between cylic topology and complexity in Graphical model in linear codes"; Sep. 2006.*
Thomas Halford, Keith Chugg, "Random redundant soft-in soft-out decoding of linear block code"; Jul. 2006.*
Etzion, T., et al., "Which codes have cycle-free Tanner graphs?" *IEEE Trans. Inform. Theory*, 45(6):2173-2181, Sep. 1999.

(Continued)

*Primary Examiner* — Siu Lee
(74) *Attorney, Agent, or Firm* — Fish & Richardson P.C.

(57) ABSTRACT

Systems, devices and techniques for soft-in, soft-out (SISO) decoding can include accessing initial soft information on a series of data units received over a communication channel, using a cyclic graphical model to represent a coding scheme associated with the received data units, obtaining cycle-free graphical models for a plurality of second conditions allowable by the coding scheme, and generating soft-out decision information by using information that includes the obtained cycle-free graphical models and the initial soft information. The number of obtained cycle-free graphical models can be less than a total number of conditions associated with the cyclic graphical model. Soft decision information can include confidence levels for each data unit.

23 Claims, 12 Drawing Sheets

OTHER PUBLICATIONS

Graell i Amat, A., et al., "New high-rate convolutional codes for concatenated schemes," *IEEE International Conference on Communications*, vol. 3, pp. 1661-1666, May 2002.

Arjhan et al., "A Novel Scheme for Irregular Parallel-Prefix Adders", 1997, IEEE Proceedings, pp. 74-78, 5 pages.

Benedetto et al., "Soft-Output Decoding Algorithms in Iterative Decoding of Turbo Codes", Feb. 15, 1996, TDA Progress Report 42-124.

Berrou et al., "An IC for Turbo-Codes Encoding and Decoding", 1995, IEEE Solid-State Circuits Conference (ISSCC 95), 3 pages.

Berrou et al., "Near Optimum Error Correcting Coding ad Decoding: Turbo-Codes", Oct. 1996, IEEE Transactions on Communications, 44( ):1261-1271, 13 pages.

Berrou et al., "Near Shannon limit error-correcting coding and decoding: Turbo-codes", 1993, ICC 93 Geneva, Technical Program, Conference Record, IEEE International Conference, vol. 2, pp. 1064-1070, 9 pages.

Brent et al., "A Regular Layout for Parallel Adders", IEEE Transactions on Computers, Mar. 1982, C-31(3):260-264, 5 pages.

Buzbee, B.L., "The Efficiency of Parallel Processing," Fall 1983, Frontiers of Supercomputing, Los Alamos Science, 71, 1 page.

Chugg et al., "Efficient architectures for soft-output algorithms", Communications, ICC 98, Conference Record, 1998 IEEE International Conference, vol. 1, pp. 126-130 (1998), 6 pages.

Cormen, et al., "Introduction to Algorithms", The MIT Press, Cambridge, Mass., 1990.

Decady, Albert (Peggy Harrod for), Authorized Officer, PCT International Application No. PCT/US01/014460, filed May 3, 2001, in International Search Report, received Aug. 6, 2001 (no mailing date available), 7 pages. (Submitted but not listed on the IDS; the Examiner initialed it).

Despain, Chapter 2: "Notes on computer architecture for high performance", in New Computer Architectures, Academic Pres, 1984, 82 pages.

Dimitrakopoulos et al., "High-Speed Parallel-Prefix VLSI Ling Adders", IEEE Transactions on Computers, vol. 54, No. 2, Feb. 2005.

Divsalar et al., "Hybrid Concatenated Codes and Iterative Decoding", TDA Progress Report 42-130, Aug. 15, 1997, 24 pages.

Forney, Jr., "The Forward-Backward Algorithm", Oct. 2, 1996, Proceedings of the Thirty-fourth Annual Allerton Conference on Communication, Control and Computing, pp. 432-446, 17 pages.

Gurkaynak et al., "Higher Radix Kogge-Stone Parallel Prefix Adder Architectures", May 28, 2000, IEEE International Symposium on Circuits and Systems, Geneva, Switzerland, pp. V609-V612, 4 pages.

Hagenauer, et al., "A Viterbi algorithm with soft-decision outputs and its applications", IEEE GLOBECOM, Nov. 27-30, 1989, vol. 3, pp. 1680-1686, 8 pages.

Hamkins, "Performance of Binary Turbo-Coded 256-ary Pulse-Position Modulation", Aug. 15, 1999, TMO Progress Report 42-138, 16 pages.

Hsu, et al., "A Parallel Decoding Scheme for Turbo Codes", Mar. 1998, IEEE International Symposium on Circuits and Systems, vol. 4, pp. IV-445-448, 4 pages.

Janik et al., "VLSI Implementation of a 32-Bit Kozen Formulation Ladner/Fischer Parallel Prefix Adder", 1995, IEEE Proceedings, 1995, pp. 57-59, 3 pages.

Kung, S. Y., "Application-Specific Array Processors," 1989, IEEE, T8-1.1-1.6, 6 pages.

Leighton, F.T., et al., "Introduction to Parallel Algorithms and Architectures: Arrays-Trees-Hypercubes", Morgan Kaufmann Publishers, Inc., 1992, pp. 1-3, 36-45, 238 and 239, 18 pages.

Ochi et al., "A High-Speed Decoding Method for Turbo-Code by Means of parallel Processing of Map Algolithms", Jan. 27, 1998, Engineering Research Report of the Institute of Electronics, Information, and Communication Engineers, 97(511):1-6, 6 pages.

Siegel et al., "Guest Editors' Introduction Parallel Processing," Nov. 1984, IEEE Transactions on Computers, c-33(11):949-951; 3 pages.

Wiberg, "Codes and Decoding on General Graphs", Dept. of Electrical Engineering, Sinkoping University, S-581 83 Sinkoping, Sweden, Dissertation No. 440 (1996), 108 pages.

Yiin et al., "MLSE and Soft-Output Equalization for Trellis-Coded Continuous Phase Modulation", Jun. 1997, IEEE Transactions on Communications, 45(6):651-659, 12 pages.

* cited by examiner

```
DecodeFirstOrderReedMuller(m, SI_0, SI_1)
Input: m, SI_0, SI_1.
Output: m, SO_0, SO_1.
begin
  if m = 2 then
    SO_0[0] ← min(SI_0[1] + SI_0[2] + SI_0[3], SI_0[1] + SI_1[2] + SI_1[3],
                  SI_1[1] + SI_0[2] + SI_1[3], SI_1[1] + SI_1[2] + SI_0[3]);
    SO_1[0] ← min(SI_1[1] + SI_0[2] + SI_0[3], SI_1[1] + SI_1[2] + SI_1[3],
                  SI_0[1] + SI_0[2] + SI_1[3], SI_0[1] + SI_1[2] + SI_0[3]);
    SO_0[1] ← min(SI_0[0] + SI_0[2] + SI_0[3], SI_0[0] + SI_1[2] + SI_1[3],
                  SI_1[0] + SI_0[2] + SI_1[3], SI_1[0] + SI_1[2] + SI_0[3]);
    SO_1[1] ← min(SI_0[0] + SI_0[2] + SI_1[3], SI_0[0] + SI_1[2] + SI_0[3],
                  SI_1[0] + SI_0[2] + SI_0[3], SI_1[0] + SI_1[2] + SI_1[3]);
    SO_0[2] ← min(SI_0[0] + SI_0[1] + SI_0[3], SI_0[0] + SI_1[1] + SI_1[3],
                  SI_1[0] + SI_0[1] + SI_1[3], SI_1[0] + SI_1[1] + SI_0[3]);
    SO_1[2] ← min(SI_0[0] + SI_0[1] + SI_1[3], SI_0[0] + SI_1[1] + SI_0[3],
                  SI_1[0] + SI_0[1] + SI_0[3], SI_1[0] + SI_1[1] + SI_1[3]);
    SO_0[3] ← min(SI_0[0] + SI_0[1] + SI_0[2], SI_0[0] + SI_1[1] + SI_1[2],
                  SI_1[0] + SI_0[1] + SI_1[2], SI_1[0] + SI_1[1] + SI_0[2]);
    SO_1[3] ← min(SI_0[0] + SI_0[1] + SI_1[2], SI_0[0] + SI_1[1] + SI_0[2],
                  SI_1[0] + SI_0[1] + SI_0[2], SI_1[0] + SI_1[1] + SI_1[2]);
  end
  else
    prepare inputs to recursive function calls under the 0 and 1 hypotheses;
    for k = 1, ..., 2^{m-1} do
      MI_{0,0}[k] ← SI_0[k] + SI_0[k + 2^{m-1}];
      MI_{0,1}[k] ← SI_1[k] + SI_1[k + 2^{m-1}];
      MI_{1,0}[k] ← SI_0[k] + SI_1[k + 2^{m-1}];
      MI_{1,1}[k] ← SI_1[k] + SI_0[k + 2^{m-1}];
    end
    decode the smaller first-order Reed-Muller code under the 0 and 1 hypotheses;
    (MO_{0,0}, MO_{0,1}) ← DecodeFirstOrderReedMuller(m - 1, MI_{0,0}, MI_{0,1});
    (MO_{1,0}, MO_{1,1}) ← DecodeFirstOrderReedMuller(m - 1, MI_{1,0}, MI_{1,1});
  end
  combine soft outputs of the two decoding trials and generate the function outputs;
  for k = 1, ..., 2^{m-1} do
    SO_0[k] ← min(MO_{0,0}[k] + SI_0[k + 2^{m-1}], MO_{0,1}[k] + SI_1[k + 2^{m-1}]);
    SO_1[k] ← min(MO_{0,1}[k] + SI_0[k + 2^{m-1}], MO_{0,0}[k] + SI_1[k + 2^{m-1}]);
    SO_0[k + 2^{m-1}] ← min(MO_{0,0}[k] + SI_0[k], MO_{0,1}[k] + SI_1[k]);
    SO_1[k + 2^{m-1}] ← min(MO_{0,1}[k] + SI_0[k], MO_{0,0}[k] + SI_1[k]);
  end
end
```

FIG. 9

CONDITIONALLY CYCLE-FREE GENERALIZED TANNER GRAPHS BASED DECODING

CLAIM OF PRIORITY

This document claims the benefit and priority of U.S. Provisional Application No. 60/975,141 entitled "Conditionally Cycle-Free Generalized Tanner Graphs: Theory and Application to High-Rate Serially Concatenated Codes" and filed on Sep. 25, 2007, which is incorporated by reference as part of the disclosure of this document.

FEDERALLY SPONSORED RESEARCH OR DEVELOPMENT

This invention was made with government support under Contract No. DAAD19-01-1-0477 awarded by the Army Research Office. The government has certain rights in the invention.

BACKGROUND

This document relates to information processing, including encoding and decoding in information and communications systems.

Noise on a communications channel, can cause the signal received from the communications channel to be different from the original signal transmitted or stored on the channel. Channel coding, or equivalently, error correction coding, relates to techniques for increasing the probability that a receiver in a communications systems will be able to correctly detect the composition of the transmitted data stream. Increasing such a probability can be accomplished by encoding a signal to add redundancy before transmition or storage. This redundancy increases the likelihood that the receiver will be able to correctly decode the encoded signal and recover the original data.

SUMMARY

This document provides examples of techniques, apparatus, and systems for processing information including the encoding and decoding of information.

In one aspect, a technique for soft-in, soft-out (SISO) decoding can include accessing initial soft information on a series of data units, the data units being processed under a coding scheme, the initial soft information can include multiple confidence levels for each data unit; using a cyclic graphical model to represent the coding scheme, the cyclic graphical model can includes multiple of variables, conditional values for the variables in the graphical model can be set over a total number of first conditions representing a total number of permutations of the plurality of variables; obtaining cycle-free graphical models for multiple of second conditions allowable by the coding scheme, the number of obtained cycle-free graphical models is less than the total number of the first conditions; and generating soft-out decision information by using information including the obtained cycle-free graphical models and the initial soft information, the soft-out decision information can include revised confidence levels for each data unit. Systems, devices, and computer program products can include one or more aspects of this technique.

This and other techniques can include one or more of the following. Generating soft-out decision information further can include running soft-in, soft-out message updates on each one of the obtained cycle-free graphical models to produce updated soft information for each one. Generating soft-out decision information can include marginalizing the updated soft information from each one of the obtained cycle-free graphical models. Generating soft-out decision information can include comparing the updated soft information from each one of the obtained cycle-free graphical models. The series of data units can include a series of binary bits.

In another aspect, a technique for soft-in, soft-out (SISO) decoding can include accessing initial soft information on a series of data units, the data units being processed under a coding scheme, the initial soft information can include multiple confidence levels for each data unit; operating a decoding scheme that processes soft information, the decoding scheme can include conditioning on a multiple states associated with the coding scheme by using one or more constraints of the coding scheme to reduce a number of states considered by the decoding scheme; using the decoding scheme to generate multiple sets of updated soft information based on each conditioned state by at least using the initial soft information; and combining the multiple sets of updated soft information to produce soft-out decision information. The soft-out decision information can include revised confidence levels for each data unit. Systems, devices, and computer program products can include one or more aspects of this technique.

This and other techniques can include one or more of the following features. The coding scheme can include an inner code and an outer code. The outer code can include an extended Hamming code. The decoding scheme can be based on a Reed-Muller code. The decoding scheme can include a SISO decoding scheme for the inner code and a SISO decoding scheme for the outer code. The decoding scheme can exchange soft information updates between the SISO decoding scheme for the inner code and the SISO decoding scheme for the outer code.

Combining the multiple sets of updated soft information can include marginalizing the multiple sets of updated soft information. The coding scheme can include an inner code and an outer code. The decoding scheme can be based on a dual code of the outer code.

An information processing device can include a demodulator configured to receive an encoded signal including a series of data units and to produce initial soft information relating to the series of data units and a processing module, communicatively coupled with the demodulator, that can be configured to perform one or more operations including one or more decoding techniques.

An information processing system can include an encoder, demodulator, and a processing module communicatively coupled with the demodulator. The encoder can encode data using a first coding scheme to produce an encoded signal including a series of data units. The demodulator can be configured to receive the encoded signal and to produce initial soft information relating to the series of data units. The processing module can be configured to perform operations including accessing the initial soft information on the series of data units, operating a decoding scheme that processes soft information, the decoding scheme includes conditioning on a plurality of states associated with the second coding scheme by using one or more constraints of the second coding scheme to reduce a number of states considered by the decoding scheme; using the decoding scheme to generate a plurality of updated soft information based on each conditioned state by at least using the initial soft information; and combining the plurality of updated soft information to produce soft-out decision information.

This and other systems can have one or more of the following. The first coding scheme can include an inner code and a first outer code. The first outer code can include an extended Hamming code. The second coding scheme can include the inner code and a second outer code. The second outer code can include a Reed-Muller code. The decoding scheme can include a soft-in, soft-out (SISO) decoding scheme for the inner code and a SISO decoding scheme for the second outer code. The decoding scheme can exchange soft information updates between the SISO decoding scheme for the inner code and the SISO decoding scheme for the second outer code. Combining the plurality of updated soft information can include marginalizing the plurality of updated soft information. The first coding scheme can include an inner code and a first outer code. The second coding scheme can include the inner code and a second outer code. The first outer code can be a dual code of the second outer code. The system can include a digital storage medium to store the encoded signal. The encoded signal can be written to and access from the digital storage medium. The system can include a communication link communicatively coupled with the encoder and the demodulator with the encoded signal being transmitted over and received from the communication link.

In yet another aspect, a computer system for soft-in, soft-out (SISO) decoding includes means for accessing initial soft information on a series of data units, the data units being processed under a coding scheme, wherein the initial soft information comprises a plurality of confidence levels for each data unit; means for using a cyclic graphical model to represent the coding scheme, wherein the cyclic graphical model comprises a plurality of variables, wherein conditional values for the variables in the graphical model are set over a total number of first conditions representing a total number of permutations of the plurality of variables; means for obtaining cycle-free graphical models for a plurality of second conditions allowable by the coding scheme, wherein the number of obtained cycle-free graphical models is less than the total number of the first conditions; and means for generating soft-out decision information by using information comprising the obtained cycle-free graphical models and the initial soft information, wherein the soft-out decision information comprises revised confidence levels for each data unit.

These and other aspects and various examples and implementations are described in greater detail in the attached drawings, the description, and the claims.

BRIEF DESCRIPTION OF THE DRAWINGS

FIG. 9 shows an example of a routine for decoding first order Reed-Muller codes.

Like reference symbols and designations in the various drawings indicate like elements.

DETAILED DESCRIPTION

Figure 1A:
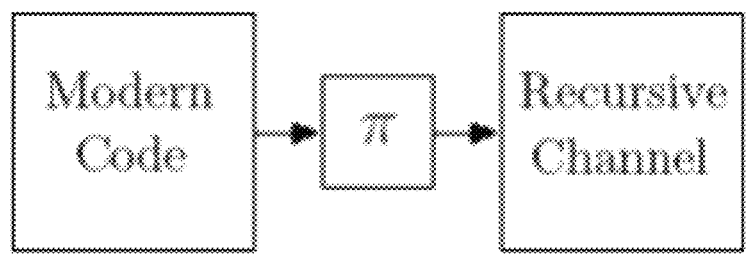
FIGS. 1A,1B show two different structures for high-rate, low-floor codes.

High-rate codes are of great interest for a number of communication/information systems that include data storage, high-speed fiber links, or wireless communications channels. The design of modern error-correcting codes which simultaneously have very low error floors (e.g. $<10^{-10}$ bit error rate) and very high rates (e.g. $>0.9$) is a particularly challenging problem of practical interest. Due to the inherent difficulty of simulating the performance of codes in the very low floor region, the design of such codes can use principles of uniform interleaver analysis. To review, on the additive white Gaussian noise (AWGN) channel with binary antipodal signaling, the bit error rate ($P_b$) and codeword error rate ($P_{cw}$) of a large class of modern codes vary asymptotically with block size as $$P_b \colon N^{\alpha_{max}} P_{cw} \colon N^{\alpha_{max}+1} \tag{1}$$

where N is the interleaver size and $\alpha_{max}$ is the maximum exponent of N in an asymptotic union bound approximation. The maximum exponent depends on both the specific code construction and constituent codes used. If the bit (codeword) error rate decays with N, then the code is said to exhibit interleaver gain in bit (codeword) error rate. Designs for codes with low floors require interleaver gain in both bit and codeword error rates and thus require $$\alpha_{max} \leq -2. \tag{2}$$

Serially concatenated code constructions (e.g., codes composed of an inner code and outer code separated by a random-like interleaver) are suited to low-floor design because, provided the inner code is recursive, the maximum exponent of Equation 1 is $$\alpha_{max} = -\left\lfloor \frac{d_{min,o}+1}{2} \right\rfloor \tag{3}$$

where $d_{min,o}$ is the minimum distance of the outer code. Since the rate of a serially concatenated code (SCC) is equal to the product of the rates of its constituent codes, the design of a high-rate, low-floor SCC requires a high-rate outer code satisfying $d_{min,o} \leq 3$.

An alternative approach to the design of high-rate low-floor codes are systematic with serially concatenated parity (S-SCP) codes such as generalized repeat accumulate (GRA) codes. The S-SCP code structure can be viewed as a systematic code with a parity generating concatenated system that resembles an SCC. S-SCP codes have the same maximum error exponent and design rules as SCCs: codes constructed with a parity generating system composed of a recursive inner parity generator and an outer code satisfying $d_{min,o} \leq 3$ achieve interleaver gain in both bit and codeword error rates. Different from SCCs, good S-SCPs can be constructed with inner parity generators that have rate greater than 1 so that the rate of outer code can be lower than the overall code rate thus alleviating the aforementioned challenge of finding high-rate, $d_{min,o} \geq 3$, outer codes with low-complexity SISO decoding algorithms.

A graphical model for a code together with a suitable message passing schedule can imply a soft-in soft-out (SISO)

decoding algorithm which is optimal if that model is cycle-free. This document includes a disclosure on a class of graphical models—generalized Tanner graphs—and the SISO decoding algorithms that they imply. While cycle-free GTGs may not support good codes, there do exist codes—such as the first order Reed-Muller codes—for which GTGs can be constructed such that conditioning on a small number of variables results in a conditionally cycle-free model. Conditionally cycle-free GTGs imply optimal SISO decoding algorithms which can in some cases be much less complex than trellis-based decoding algorithms. Such low-complexity decoding algorithms are presented for the first-order Reed-Muller codes and their duals: the extended Hamming codes. Extended Hamming codes can offer an alternative to high-rate convolutional codes—in terms of both performance and complexity—for use in very high-rate, very low-floor, serially concatenated coding schemes.

A S-SCP design philosophy is not directly applicable to a large class of systems which have recursive channels. The term recursive channel is introduced to describe systems in which the aggregate of the modulation and (possible) precoding with the channel is recursive. Examples of recursive channels include continuous phase modulations over AWGN and fading channels and models for precoded magnetic recoding channels such as EPR4.

Figure 1B:
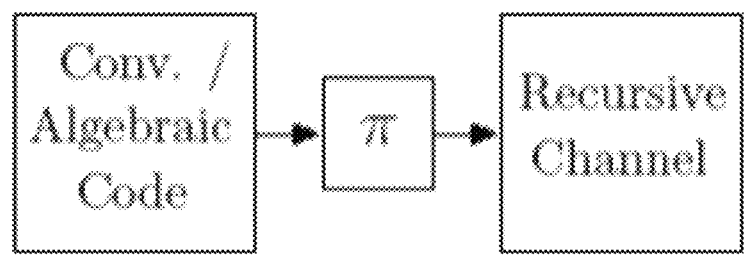

FIGS. 1A and 1B show two different structures for high-rate, low-floor codes for use in systems with recursive channels. In FIGS. 1A and 1B, random-like interleavers are labeled t. FIG. 1A shows a structure that includes a high-rate modern code (e.g. an SCC or S-SCP) in serial concatenation with a recursive channel. FIG. 1B shows a different structure that replaces the modern outer code with a classical code (e.g. convolutional or algebraic block code). While both structures have the potential to offer the desired bit and codeword error rate performance, e.g., low floors, the structure in FIG. 1B is more beneficial for application in practical systems. Specifically, the use of a classical outer code for which there exists a simple non-iterative SISO decoding algorithm offers reductions in decoding complexity, decoding latency, and required memory with respect to a modern, iteratively decoded, outer code. As with the design of SCCs for the AWGN channel, the design of such codes requires a high-rate, e.g., $d_{min}$ greater than or equal to 3, outer classical code for which there exists a low-complexity optimal SISO decoding algorithm.

This document presents examples of low-complexity SISO decoding algorithms. These examples include low-complexity SISO decoding algorithms for a family of extended Hamming codes based on variable conditioning in generalized Tanner graphs. Extended Hamming codes can offer a better alternative to high-rate convolutional codes for use as outer codes in serial concatenation with recursive inner channels.

Generalized Tanner Graphs

Let C be an [n,k,d] binary linear block code and let $$I \subseteq \{1, 2, \ldots, n\} \quad (4)$$

be some subset of the coordinate index set of C. A generalized extension of C, $\tilde{C}$, is formed by adding a parity-check on the bits corresponding to the index set I to C (e.g., a partial parity-check). Note that if I={1,2, ..., n} then $\tilde{C}$ is a classically defined extended code. The generalized extended code $\tilde{C}$ has length n+1, dimension k and minimum distance either d or d+1 depending on the choice of I. If C has an n−k×n parity-check matrix $H_C$, then $\tilde{C}$ has an n−k+1×n+1 parity-check matrix $$H_{\tilde{C}} = \begin{bmatrix} i_1 & i_2 & \ldots & i_n & 1 \\ & & & & 0 \\ & H_C & & & \vdots \\ & & & & 0 \end{bmatrix} \quad (5)$$

where $i_j$=1 if j ∈I and 0 otherwise.

A degree-g generalized extension of C is formed by adding g partial parity bits to C. Note that the $j^{th}$ partial parity bit, $c_{n+j}$, in such an extension forms a partial parity on any of the bits $c_i$, for i∈{1, ..., n+j−1}.

This disclosure introduces the term generalized Tanner graph (GTG) to denote the Tanner graph corresponding to the parity-check matrix of a generalized code extension. Specifically, let $\tilde{C}$ be a degree-g generalized extension of the [n,k,d] binary linear block code C and let $\tilde{H}=[h_g]$ be an (n−k+g)×(n+g) parity check matrix for $\tilde{C}$. The GTG associated with $\tilde{H}$ is the bipartite graph $G_{\tilde{n}}(U \cup W, E)$ with disjoint vertex classes:

$$U = \{u_i\}_{i=1}^{n+g} \text{ and } W = \{w_j\}_{j=1}^{n-k+g} \quad (6)$$

corresponding to the columns and rows of $\tilde{H}$, respectively. An edge connects $u_i$ and $w_j$ in $G_{\tilde{n}}$ if and only if $h_{ij}$=1. $H_{\tilde{C}}$, as defined in (5) is a generalized parity-check matrix for C.

This document introduces the term generalized Tanner graph in order to stress that such a graphical representation can be viewed equivalently as a graphical model for C which contains hidden (partial parity) variables or as a Tanner graph for the generalized code extension $\tilde{C}$.

As an example, consider the [8,4,4] first-order Reed-Muller code, $C_{RM(1,3)}$, any codeword of which can be decomposed via a squaring construction as $$c = (c_1, c_2, c_3, c_4, c_5, c_6, c_7, c_8) \quad (7)$$
$$= (u_1, u_2, u_3, u_4, u_1+v_1, u_2+v_2, u_3+v_3, u_4+v_4)$$
$$= (u, u+v)$$

where u is drawn from the [4,3,2] single parity-check code and v is drawn from the [4,1,4] repetition code. A parity-check matrix for $C_{RM(1,3)}$ is $$H_{RM(1,3)} = \begin{bmatrix} 1 & 1 & 1 & 1 & 1 & 1 & 1 & 1 \\ 0 & 1 & 0 & 1 & 0 & 1 & 0 & 1 \\ 0 & 0 & 1 & 1 & 0 & 0 & 1 & 1 \\ 0 & 0 & 0 & 0 & 1 & 1 & 1 & 1 \end{bmatrix}. \quad (8)$$

A degree-1 generalized extension $\tilde{C}_{RM(1,3)}$ can be formed by adding the partial parity bit $c_4+c_8=v_4$ to $C_{RM(1,3)}$. A parity-check matrix for $\tilde{C}_{RM(1,3)}$ formed from (8) as per (5) is $$\tilde{H}_{RM(1,3)}^{(1)} = \begin{bmatrix} 0 & 0 & 0 & 1 & 0 & 0 & 0 & 1 & 1 \\ 1 & 1 & 1 & 1 & 1 & 1 & 1 & 1 & 0 \\ 0 & 1 & 0 & 1 & 0 & 1 & 0 & 1 & 0 \\ 0 & 0 & 1 & 1 & 0 & 0 & 1 & 1 & 0 \\ 0 & 0 & 0 & 0 & 1 & 1 & 1 & 1 & 0 \end{bmatrix}. \quad (9)$$

Row operations on $H_{RM(1,3)}^{(1)}$ yield the parity-check matrix $$H_{RM(1,3)}^{(2)} = \begin{bmatrix} 1 & 1 & 1 & 1 & 0 & 0 & 0 & 0 & 0 \\ 1 & 0 & 0 & 0 & 1 & 0 & 0 & 0 & 1 \\ 0 & 1 & 0 & 0 & 0 & 1 & 0 & 0 & 1 \\ 0 & 0 & 1 & 0 & 0 & 0 & 1 & 0 & 1 \\ 0 & 0 & 0 & 1 & 0 & 0 & 0 & 1 & 1 \end{bmatrix}. \quad (10)$$

Figure 2:
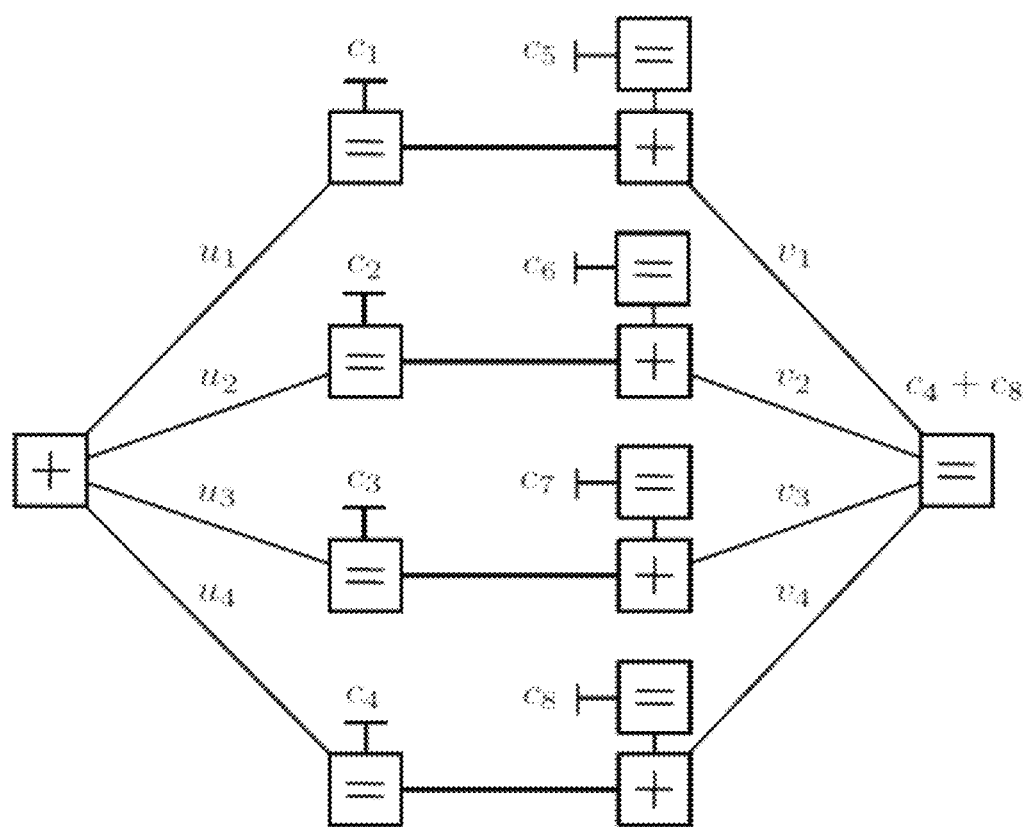
FIG. 2 shows a Generalized Tanner graph (GTG) for a [8,4,4] first-order Reed-Muller code.

FIG. 2 shows a Generalized Tanner graph (GTG) for the [8,4,4] first-order Reed-Muller code implied by a squaring construction, the GTG corresponding to $H_{RM(1,3)}^{(2)}$.

Cycle-free graphical models for codes imply optimal SISO decoding algorithms. Cycle-free generalized Tanner graphs imply low-complexity SISO decoding algorithms because in a GTG, hidden variables can be binary and local constraints can be binary single parity check codes or binary repetition codes.

It was shown by Etzion (see T. Etzion, A. Trachtenberg, and A. Vardy, "Which codes have cycle-free Tanner graphs?" in IEEE Trans. Information Theory, vol. 45, no. 6, pp. 2173-2181, September 1999) that there exists a cycle-free Tanner graph corresponding to an [n,k,d] binary linear block code C only if $$d \leq \left\lfloor \frac{n}{k+1} \right\rfloor + \left\lfloor \frac{n+1}{k+1} \right\rfloor \quad (11)$$

and thus Etzion concluded that cycle-free Tanner graphs cannot support good codes. However, Etzion's result does not immediately extend to generalized Tanner graphs because there exist codes with cycle-free GTGs for which there exist no cycle-free Tanner graphs. For example, consider the [13,4,5] code, $C_{[13,4,5]}$, generated by $$G_{[13,4,5]} = \begin{bmatrix} 1 & 1 & 1 & 1 & 1 & 0 & 0 & 0 & 0 & 0 & 0 & 0 & 0 \\ 0 & 0 & 1 & 1 & 1 & 1 & 1 & 0 & 0 & 0 & 0 & 0 & 0 \\ 0 & 0 & 0 & 0 & 0 & 1 & 1 & 1 & 1 & 1 & 0 & 0 & 0 \\ 0 & 0 & 0 & 0 & 0 & 0 & 0 & 0 & 1 & 1 & 1 & 1 & 1 \end{bmatrix} \quad (12)$$

Figure 3:
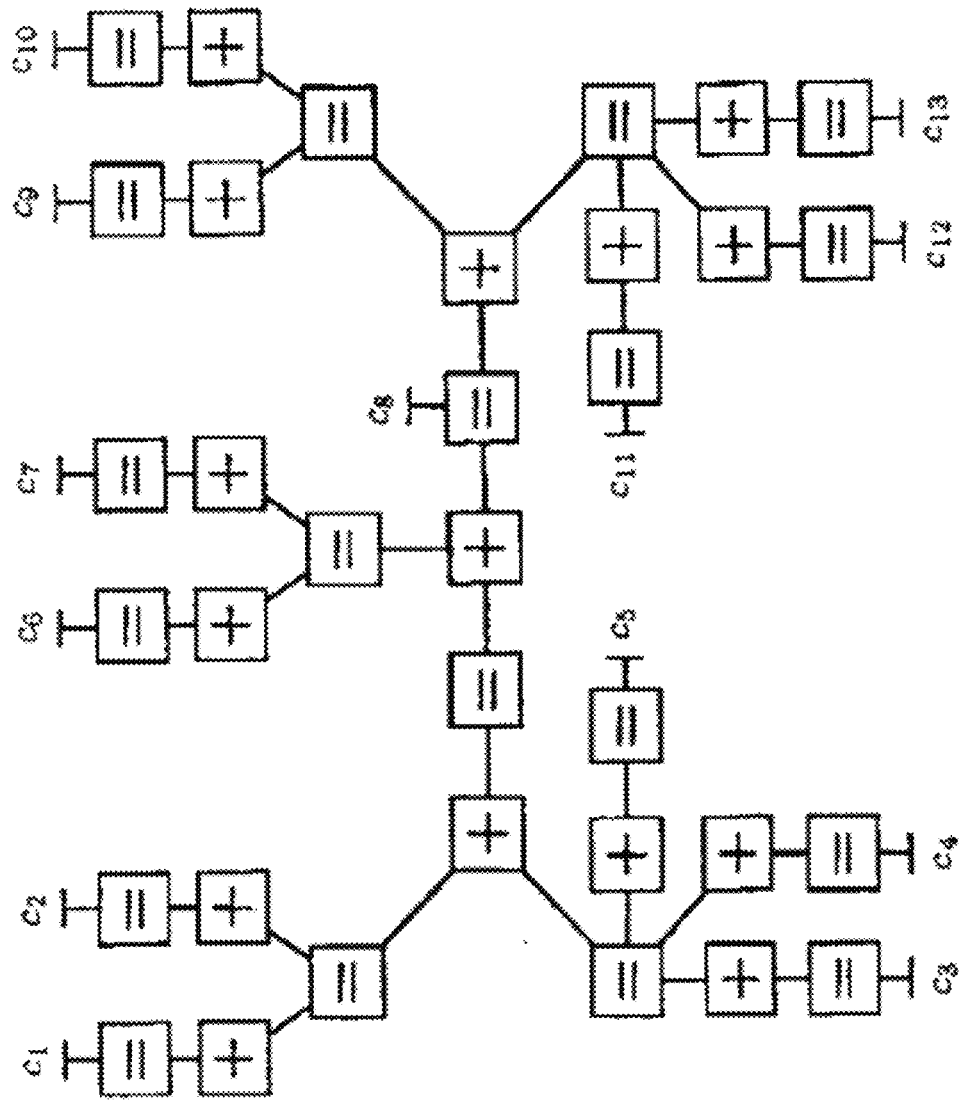
FIG. 3 shows a cycle-free GTG for $C_{[13,4,5]}$.

By Equation 11, a length 13, dimension 4 code has a cycle-free Tanner graph only if $d \leq 4$ and there is thus no cycle-free Tanner graph for $C_{[13,4,5]}$. FIG. 3 shows a cycle-free GTG for $C_{[13,4,5]}$.

Observe that $C_{[13,4,5]}$ achieves d=5 by repeating bits. In the following, it is shown that under the reasonable assumption that a generalized code extension $\tilde{C}$ contains no repeated bits, Etzion's result can be extended to generalized Tanner graphs—cycle-free GTGs cannot support good codes.

Theorem 1: Let C be an [n,k,d] code such that there exists a cycle-free generalized Tanner graph corresponding to C that contains no repeated bits. Then $$d \leq 2. \quad (13)$$

Proof. Let the cycle-free GTG G correspond to a degree-g generalized extension of C, $\tilde{C}$, with parameters [n+g,k,$\tilde{d}$] and dual distance $\tilde{d}^\perp \geq 3$ (so that no bits are repeated). There are $$V = 2n + 2g - k \quad (14)$$

vertices and at least $$E \geq 3(n-k+g) \quad (15)$$

edges in G. Since a connected graph is cycle-free if and only if $E \leq V-1$, $$n+g<2k, \quad (16)$$

and $\tilde{C}$ is a rate $$\tilde{R} = k/(n+g) > \frac{1}{2} \quad (17)$$

code for which there exists a cycle-free Tanner graph. Etzion's result thus requires that $$\tilde{d} \leq 2. \quad (18)$$

The result then follows from the observation that $d \leq \tilde{d}$.

Conditionally Cycle-Free Generalized Tanner Graphs

Because cycle-free generalized Tanner graphs do not support good codes, a more complex graphical model is required in order to obtain optimal SISO decoding algorithms for a set of codes. This document considers the graphical models obtained by conditioning on the values, e.g., binary values, of hidden variables in cyclic generalized Tanner graphs. Hidden variable conditioning in the context of tail-biting trellises have been studied. It is understood that if a tail-biting trellis contains a hidden (state) variable, V, with alphabet size $2^m$ then optimal SISO decoding can be performed on this trellis by decoding on $2^m$ cycle-free conditional trellises (one per possible value of V) and then appropriately marginalizing over the results of the decoding rounds. This document applies the notion of hidden variable conditioning to generalized Tanner graphs.

As an example, consider again the GTG for the [8,4,4] first-order Reed-Muller code, $C_{RM(1,3)}$, illustrated in FIG. 2 and suppose that the partial parity variable $c_4+c_8$ is not considered unknown but fixed to be either a 0 or a 1. This conditional GTG is illustrated in FIG. 4.

Figure 4:
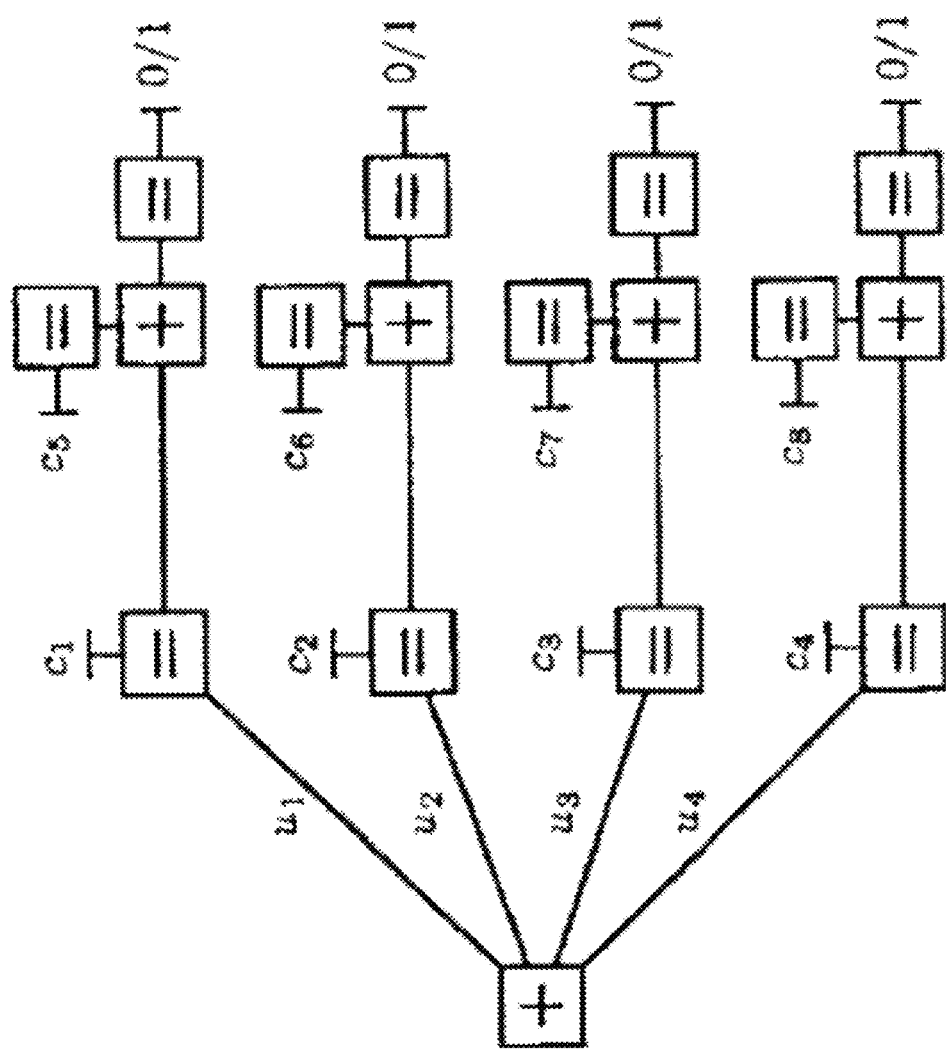
FIG. 4 shows a conditionally cycle-free GTG for the [8,4,4] first-order Reed-Muller code.

FIG. 4 shows a conditionally cycle-free generalized Tanner graph for the [8,4,4] first-order Reed-Muller code. In FIG. 4, the conditional variable $c_4+c_8$ is treated as a visible, deterministic variable as indicated by the half-edges labeled by '0/1'. The GTG illustrated in FIG. 4 is cycle-free; optimal SISO decoding of a code with such a model can be accomplished by decoding twice on the conditionally cycle-free model (once with $c_4+c_8=0$ and once with $c_4+c_8=1$) and then appropriately marginalizing over the results of the two decoding rounds. Specifically, the soft-out information on each codeword bit is computed for both the $c_4+c_8=0$ and $c_4+c_8=1$ cases (i.e. $SO[c_i|c_4+c_8=0]$ and $SO[c_i|c_4+c_8=1]$ for i=1, ..., 8) and then in the case of min-sum processing, the soft-out information on each codeword bit $SO[c_i]$ is computed as $$SO[c_i] = \min(SO[c_i|c_4+c_8=0], SO[c_i|c_4+c_8=1]) \quad (19)$$

for i=1, ..., 8. Note that the min operator in (19) is replaced by $\min^{\text{å}}$ in the case of $\min^{\text{å}}$-sum processing.

More generally, a degree-f conditionally cycle-free generalized Tanner graph contains f variables which can be fixed to remove all cycles. Optimal SISO decoding can be achieved by decoding $2^f$ times on a degree-f conditionally cycle-free GTG (and appropriately marginalizing over the results). Denote by $f_{min}(C)$ the smallest f such that there exists a degree-f conditionally cycle-free GTG for a given code C. Since every code can be represented by a systematic parity-check matrix, there is a trivial upper-bound on this minimum degree:

$$f_{min}(C) \leq k-1. \quad (20)$$

Note that Theorem 1 requires that $f_{min}(C_{RM(1,3)})$ is strictly greater than zero and it has thus been shown by construction that $$f_{min}(C_{RM(1,3)}) = 1. \quad (21)$$

Conditionally cycle-free generalized Tanner graphs are interesting insofar as they can potentially imply optimal SISO decoding algorithms whose complexity are less than that of SISO trellis decoding. For example, SISO trellis decoding of $C_{RM(1,3)}$ (using min-sum or min$^a$-sum processing on a minimal bit-level trellis) requires 176 additions and 50 comparisons 1 while optimal SISO decoding using the degree-1 conditionally cycle-free GTG described above requires 72 additions and 32 comparisons. A comparision operation can denote min operations in the case of min-sum processing and min$^a$ operations in the case of min$^a$-sum processing.

Conditionally Cycle-Free GTGs for First-Order Reed-Muller Codes

Let $C_{RM(r,m)}$ denote the Reed-Muller code with parameters $$n = 2^m, k = \sum_{j=0}^{r} \binom{m}{j}, d = 2^{m-r}. \tag{22}$$

The universal code of length $2^m$ is thus denoted $C_{RM(m,m)}$ while the length $2^m$ repetition code is $C_{RM(0,m)}$. The following demonstrates that there exist degree-(m−2) conditionally cycle-free generalized Tanner graphs for $C_{RM(1,m)}$ when $m \geq 3$. Since k=m+1 for these codes, degree-(m−2) conditional cycle-free GTGs require 2 less fixed variables than the upper bound given by Equation 20 and thus imply optimal SISO decoding algorithms with approximately 4 times less computation than this worst case.

Theorem 2: There exists a degree-(m−2) conditionally cycle-free generalized Tanner graph for $C_{RM(1,m)}$, $m \geq 3$.

Proof. By induction on m. The m=3 case was shown by construction in Section 2. Suppose that there exists a degree-(m−3) conditionally cycle-free graphical model for $C_{RM(1,m-1)}$. There exists a squaring construction for $C_{RM(1,m)}$ such that if $c \in C_{RM(1,m)}$ then $$c = (u, u+v) \tag{23}$$

where $u \in C_{RM(1,m-1)}$ and $v \in C_{RM(0,m-1)}$. A GTG for this code is illustrated in FIG. 2. The code vertex labeled $C_{RM(1,m-1)}$ corresponds to a GTG for that code.

By the induction hypothesis, a degree-(m−2) conditionally cycle-free GTG is formed by conditioning on the repetition constraint $C_{RM(0,m-1)}$ and on m−3 variables in the model corresponding to $C_{RM(1,m-1)}$.

Figure 5:
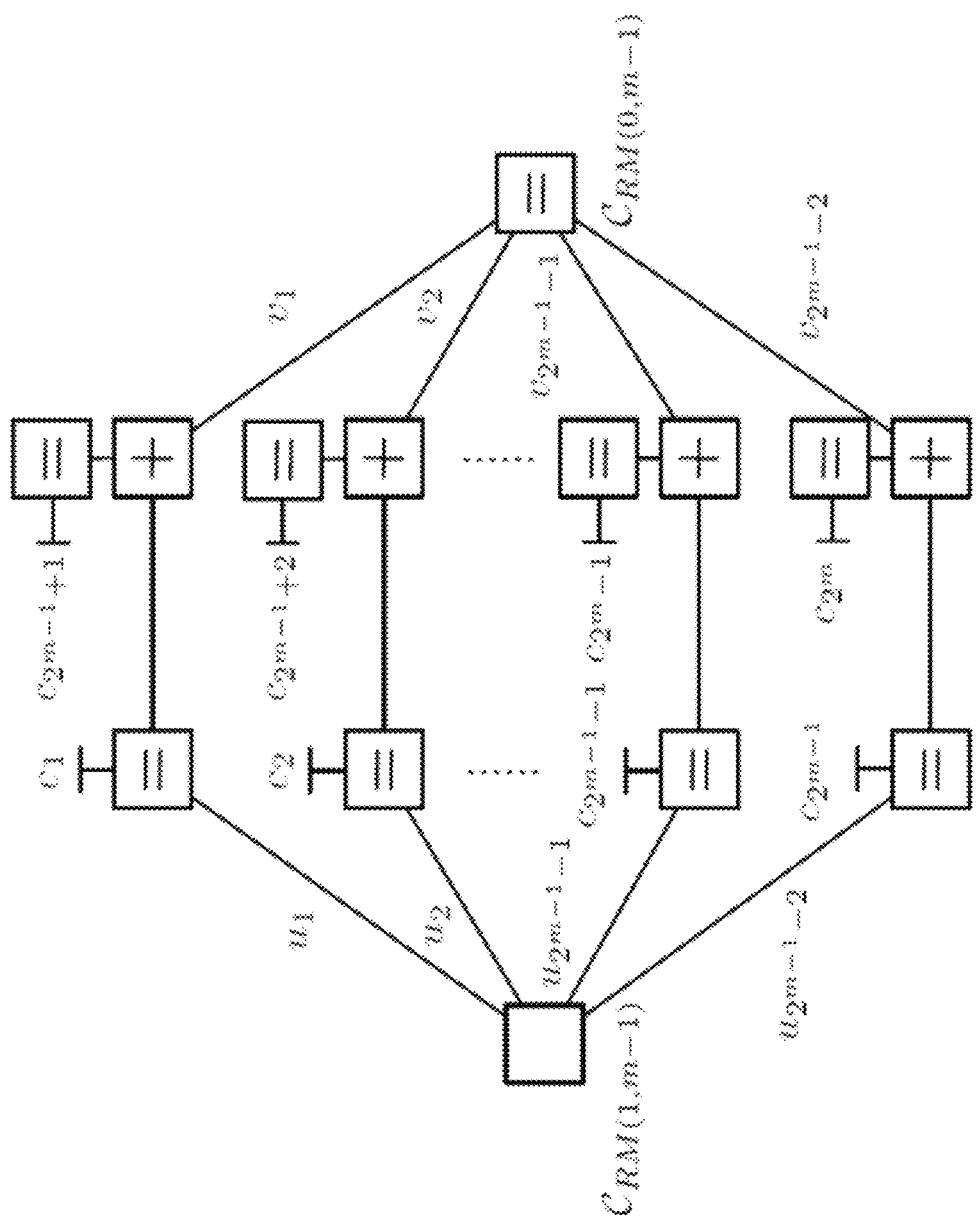
FIG. 5 shows a GTG for the $[2^m, m+1, 2^{m-1}]$ Reed-Muller code implied by a squaring construction.

FIG. 5 shows a Generalized Tanner graph for the $[2^m, m+1, 2^{m-1}]$ Reed-Muller code implied by a squaring construction.

An optimal SISO decoding algorithm for a code C implies an optimal SISO decoding algorithm for its dual $C^\perp$. The conditionally cycle-free GTGs for first-order Reed-Muller codes described above thus imply optimal SISO decoding algorithms for the family of Reed-Muller codes with parameters $[2^m, 2^m-m-1, 4]$: the extended Hamming codes.

Let $A_m$ and $C_m$ denote the number of addition and comparison operations required by the optimal SISO decoding algorithm implied by the conditionally cycle-free GTG for $C_{RM(1,m)}$ described above. Counting operations in the binary graphical model illustrated in FIG. 2 yields the following recursion for $A_m$ and $C_m$:

$$A_m = 3 \cdot 2^m 2 A_{m-1} \tag{24}$$

$$C_m = 2^m + 2 C_{m-1} \tag{25}$$

Note that these formulae include the comparisons required for marginalizing over the results of the individual decoding rounds. It is clear that the complexity of SISO decoding using the proposed conditionally acyclic binary graphical models thus grows as $O(n \log n)$ which is an improvement over deocoders that grow as $O(n^2)$.

Table 1 shows an example of the complexity of trellis decoding technique versus a decoding technique that uses an optimal SISO decoding algorithm (e.g., CCF-GTG). To demonstrate that conditionally cycle-free generalized Tanner graphs (CCF-GTGs) can imply substantially less complex optimal SISO decoding algorithms than bit-level trellises, the number of add and compare operations for each SISO decoding algorithm is tabulated in Table 1 for a number of first-order Reed-Muller codes. The trellis complexity was evaluated by considering the total number of addition and comparison operations required to perform the full SISO BCJR algorithm (rather that soft-in hard-out Viterbi decoding) on the bit-level trellises with minimal state complexities.

TABLE 1

|  | Trellis | | CCF-GTG | |
| --- | --- | --- | --- | --- |
|  | Add | Compare | Add | Compare |
| $C_{RM(1,3)}$ | 176 | 50 | 96 | 32 |
| $C_{RM(1,4)}$ | 1008 | 426 | 288 | 96 |
| $C_{RM(1,5)}$ | 4720 | 2202 | 768 | 256 |
| $C_{RM(1,6)}$ | 20336 | 9850 | 1920 | 640 |
| $C_{RM(1,7)}$ | 84336 | 41530 | 4608 | 1536 |
| $C_{RM(1,8)}$ | 343408 | 170426 | 10752 | 3584 |

Examples of Applications

Graell i Amat (See A. G. i Amat, G. Montorsi, and S. Benedetto, "New high-rate convolutional codes for concatenated schemes," in Proc. International Conf. Communications, vol. 3, New York, N.Y., May 2002, pp. 1661-1666) studied a serially concatenated coding scheme that includes a high-rate convolutional outer code and a recursive rate-1 inner code corresponding to a simplified discrete-time model of a precoded EPR4 magnetic recording channel. Specifically, the recursive channel model includes a $1/1 \oplus D^2$ precoder followed by a digital recording channel subject to intersymbol interference (ISI) with partial response polynomial $1+D-D^2-D^3$ followed finally by an AWGN channel. The precoder and ISI can be jointly decoded on an 8-state trellis.

The performance of Graell i Amat's scheme is compared to one which replaces the high-rate convolutional codes with extended Hamming codes. Specifically, 4 convolutional outer codes with input block size 4000 bits and respective rates 8/9, 9/10, 11/12 and 16/17 are compared to four algebraic outer codes composed of the following mixtures of extended Hamming codes 1) the mixture of 3 $C_{RM(3,5)}$ and 69 $C_{RM(4,6)}$ codewords resulting in a code with input block size 4011 bits and rate 4011/4512=0.8890≈8/9, 2) the mixture of 56 $C_{RM(4,6)}$ and 7 $C_{RM(5,7)}$ codewords resulting in a code with input block size 4032 bits and rate 4032/4480=9/10, 3) the mixture of 30 $C_{RM(4,6)}$ and 19 $C_{RM(5,7)}$ codewords resulting in a code with input block size 3990 bits and rate 3990/4352=0.9168≈11/12, 4) the mixture of 2 $C_{RM(4,6)}$, 26 $C_{RM(5,7)}$ and 3 $C_{RM(6,8)}$ codewords resulting in a code with input block size 3975 bits and rate 3975/4224=0.9411≈16/17.

Serially concatenated codes using convolutional codes can utilize s-random interleavers. The codes using mixed extended Hamming outer codes can utilize high sum-spread pseudo-random interleavers that were generated using a real-relaxation optimization method.

Figure 6:
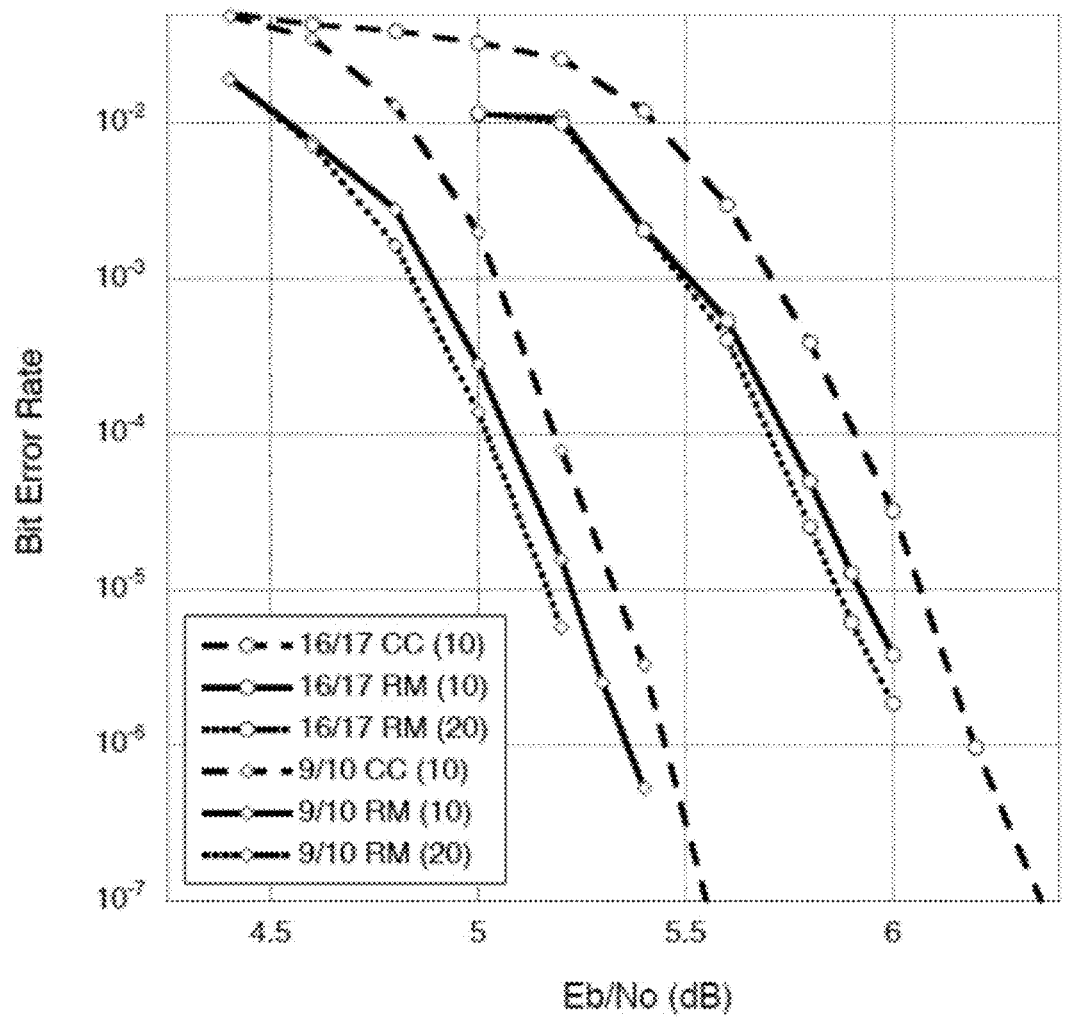
FIG. 6 shows an example of a bit error rate performance of rate 8/9 and 11/12 serially concatenated codes.
Figure 7:
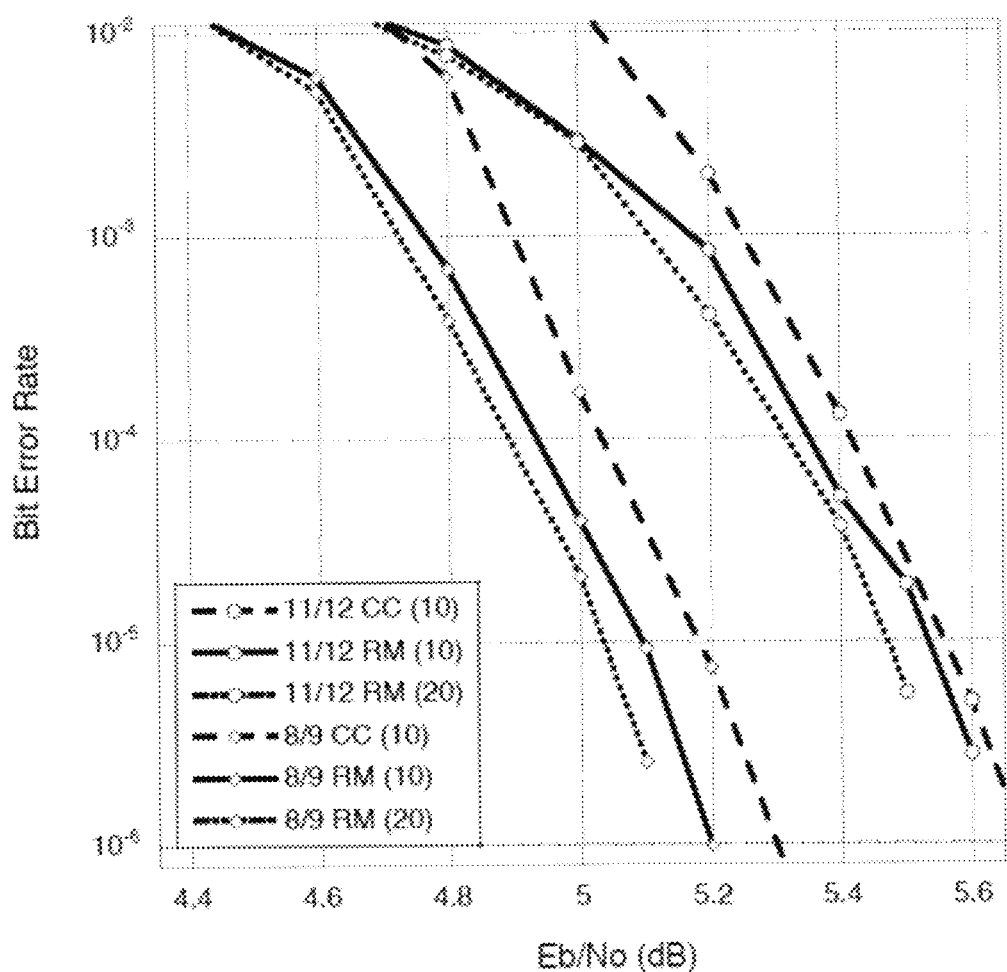
FIG. 7 shows an example of a bit error rate performance of rate 9/10 and 16/17 serially concatenated codes.

FIG. 6 shows an example of the bit error rate performance of the respective rate 8/9 and 11/12 serially concatenated codes. FIG. 7 shows an example of the bit error rate performance of the respective rate 9/10 and 16/17 serially concatenated codes. FIG. 6 compares the performance of the respective rate 8/9 and 11/12 codes while FIG. 7 compares the performance of the respective rate 10/11 and 16/17 codes. Note that the performance of the serially concatenated codes with convolutional outer codes is reported for 10 decoding iterations while the performance of the codes with mixed extended Hamming outer codes is reported for 10 and 20 decoding iterations. All curves correspond to $\min^a$-sum processing (or its dual-domain equivalent).

Observe in FIGS. 6 and 7 that the codes constructed with mixed extended Hamming outer codes consistently outperform those with convolutional outer codes of similar rates and input block sizes. The mixed extended Hamming codes compare favorably to their high-rate convolutional code counterparts in terms of complexity also. Table 2 tabulates the average number of add and comparison operations per input bit, per decoding iteration, required for optimal SISO decoding (using the CCF-GTG algorithm) for each of the mixed extended Hamming codes.

TABLE 2

| Rate | Add/Bit | Compare/Bit |
|---|---|---|
| 8/9 | 20.2 | 7.9 |
| 9/10 | 20.7 | 8.0 |
| 11/12 | 21.5 | 8.2 |
| 16/17 | 22.8 | 8.7 |

The rate k/k+1 convolutional outer-codes in Graell i Amat were decoded on the 16- (for k=8,9,10) and 32- (for k=16) state trellises corresponding to their respective rate 1/1+k duals. Optimal SISO decoding on a rate 1/1+k, 16- (32) state trellis requires at least 96 (192) additions and 64 (128) comparisons per input bit, per decoding iteration. Thus, if one assumes that an addition and comparison operation have roughly the same complexity, then the complexity of the proposed mixed extended Hamming code SISO decoding algorithms are approximately 5 to 10 times less than that of a respective high-rate convolutional code decoding algorithms. This assumption is reasonable for min-sum processing. For $\min^a$-star processing, this assumption is also reasonable provided a table-lookup is used for the correction term in the $\min^a$ operator. This assumption is reasonable for min-sum processing.

Figure 8:
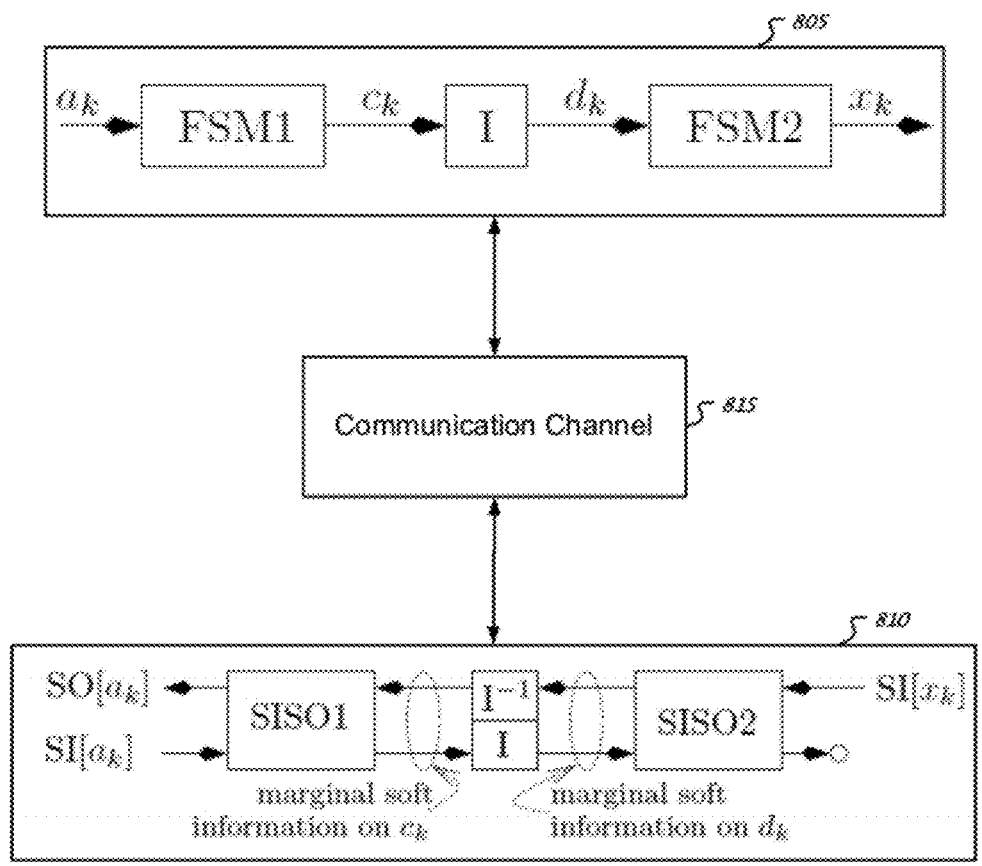
FIG. 8 shows an example of a communication system with encoder and decoder modules.

FIG. 8 shows an example of a communication system with encoder and decoder sections. An encoder 805 architecture can include an interleaved serial concatenation of two blocks defined by a first finite state machine, FSM1, and a second finite state machine, FSM2. The I box in encoder 805 represents an interleaver. A decoder 810, corresponding to encoder 805, can include a processing module that is configure to perform a decoding algorithm related to the serially concatenated system used in encoder 805. The I box in decoder 810 represents an interleaver and the $I^{-1}$ box represents a reverse interleaver. Soft information can be passed between soft-in soft-out (SISO) decoding algorithms, such as SISO1 and SISO2, for constituent subsystems. In decoder 810, SI represents an input vector of soft information, and SO represents an output vector of updated soft information.

A communication channel 815 can communicatively couple the encoder module 805 with the decoder module 810. In some implementations, channel 815 can include at least a portion of communication link such as a fiber optical link, satellite link, or wireless terrestrial link. In some implementations, channel 815 can include a digital storage medium where an output from the encoder 805 is written to the storage medium and read from the storage medium by the decoder module 810. The decoder module 810 can be separate from or integrated with a demodulation module that processes the encoded signal.

FIG. 9 shows an example of a routine for decoding first order Reed-Muller codes. This routine, DecodeFirstOrderReedMuller, is an example of an implementation of the subject matter disclosed herein when applied to the min-sum decoding of a length $2^m$ first-order Reed-Muller (RM) code for any $m \geq 2$. This routine can be generalized to decoding algorithms for extended Hamming codes via a dualization procedure. Furthermore, the routine can be extended to decoding algorithms over other semi-rings (e.g., sum-product decoding in the linear or log domains). The inputs to the routine include m, which determines the codeword length; $SI_0$, the vector of input metrics for 0 bit values so that $SI_0[k] = -\log(\Pr\{c_k=0\})$ for $k \in [1,2^m]$; and $SI_1$ the similarly defined vector of input metrics for 1 bit values. The routine returns the output metric vectors $SO_0$ and $SO_1$. In some implementations, this routine can be iteratively repeated to continue to revise the initial soft information.

Figure 10:
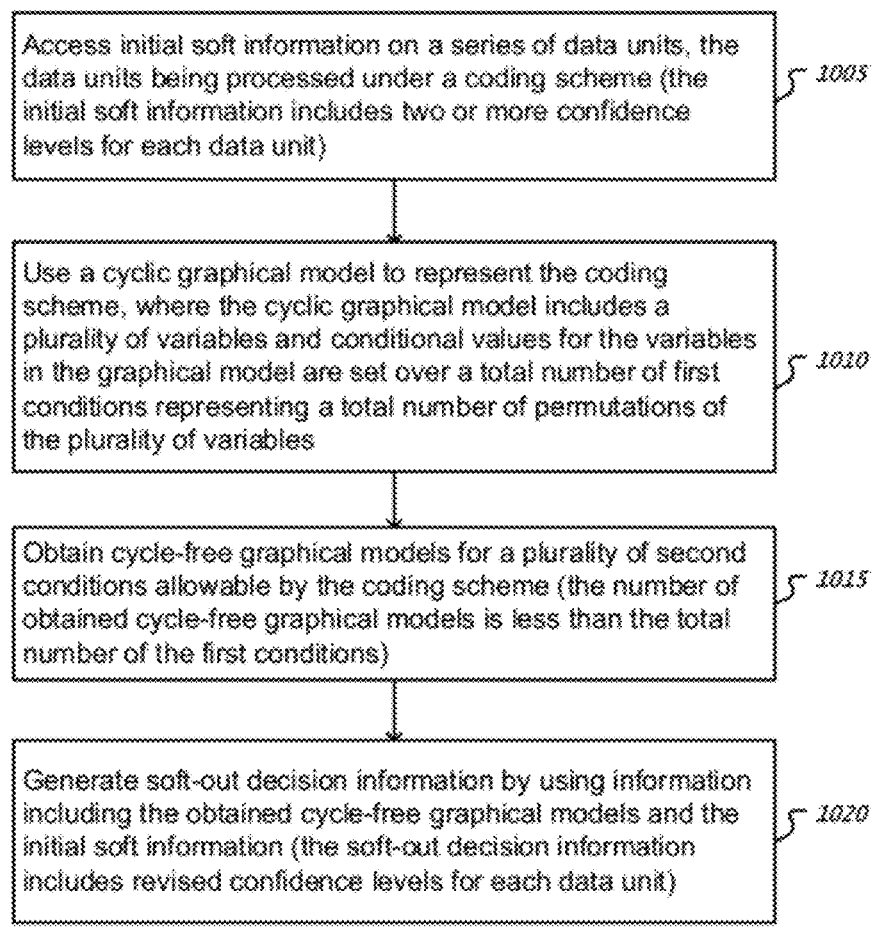
FIG. 10 shows an example of a SISO decoding technique.

FIG. 10 shows an example of a SISO decoding technique. A decoding technique can include accessing 1005 initial soft information on a series of data units. The data units can be processed under a coding scheme. The initial soft information can includes two or more confidence levels for each data unit such. The confidence levels can be derived from a log of a probability of a data unit be set to either a zero or a one. In some implementations, a data unit is a binary value such as a bit.

The technique can use 1010 a cyclic graphical model to represent the coding scheme. The cyclic graphical model can include a plurality of variables where conditional values for the variables in the graphical model are set over a total number of first conditions representing a total number of permutations of the plurality of variables. The technique can obtain 1015 cycle-free graphical models for a plurality of second conditions allowable by the coding scheme—the number of obtained cycle-free graphical models is less than the total number of the first conditions. In other words, constraints imposed by the coding scheme can be utilized to prune permutations of the variables that are not allowed by the coding scheme.

The technique can generate 1020 soft-out decision information by using information including the obtained cycle-free graphical models and the initial soft information. The soft-out decision information can include revised confidence levels for each data unit. A decoder implementing the technique of FIG. 10 can repeatedly apply the technique to refine the soft-out decision information.

Figure 11:
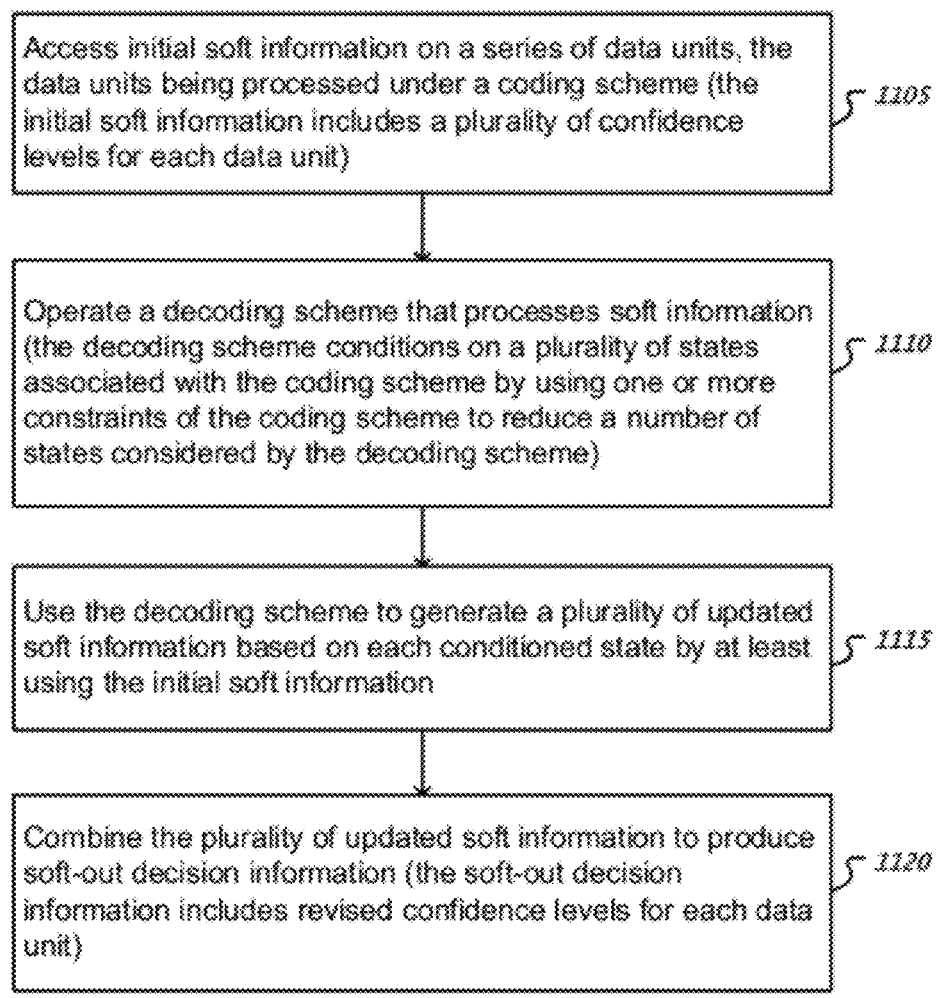
FIG. 11 shows a different example of a SISO decoding technique.

FIG. 11 shows a different example of a SISO decoding technique. The technique can access 1105 initial soft information on a series of data units. The data units can be processed under a coding scheme of the decoding. The initial soft information can includes a plurality of confidence levels for each data unit. The technique can operate 1110 a decoding scheme that processes soft information. The decoding scheme can condition on a plurality of states associated with the coding scheme by using one or more constraints, such as parity checks, of the coding scheme to reduce a number of states considered by the decoding scheme. The technique can use 1115 the decoding scheme to generate a plurality of updated soft information based on each conditioned state by at least using the initial soft information. The technique can combine 1120 the plurality of updated soft information to produce soft-out decision information. The soft-out decision information can include revised confidence levels for each data unit. The soft-out decision information can be input to a next iteration of the decoding scheme to further revise the confidence levels.

Figure 12:
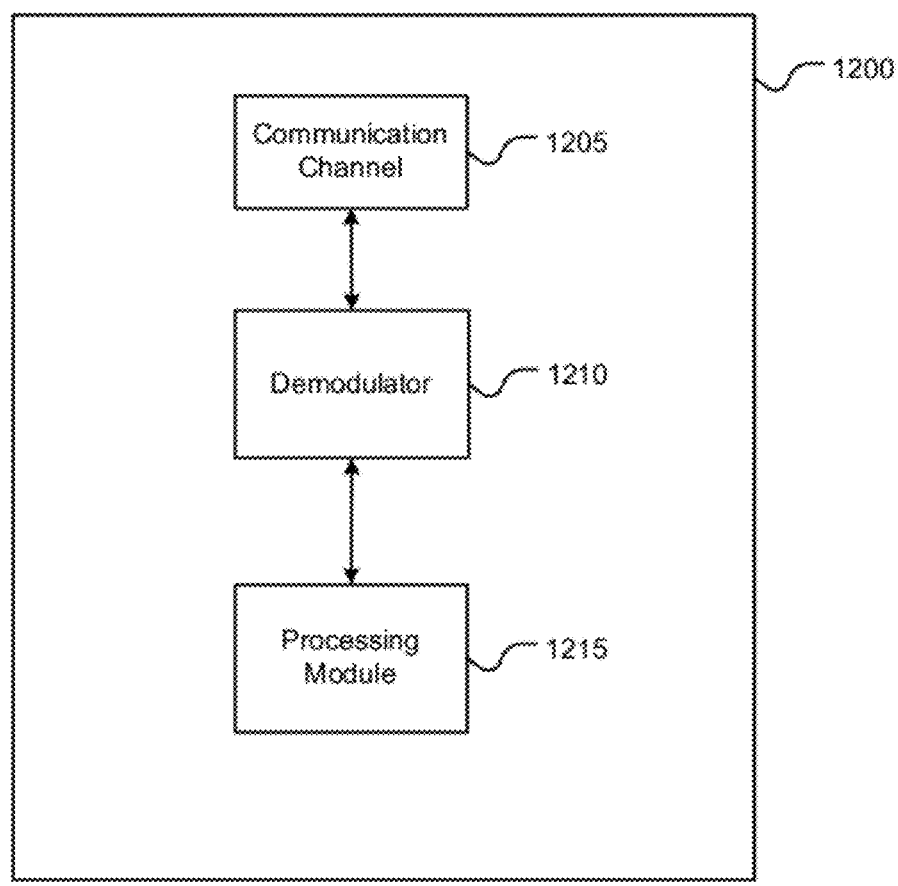
FIG. 12 shows an example of information processing device architecture used to implement decoding techniques.

FIG. 12 shows an example of information processing device architecture used to implement decoding techniques. An information processing device 1200 such as an optical communication receiver/transmitter, digital storage device, or wireless communication device can include a communication channel 1205, demodulator 1210, and processing module 1215. In some implementations, a communication channel can include a portion of a communication link being optical, electronic, or wireless. In some implementations, a communication channel can include a digital storage medium such as a magnetic recording medium. The processing module 1215 can include one or more processors to execute operations that include one or more of the decoding techniques presented herein. In some implementations, the demodulator 1210, and processing module 1215 can be integrated. Processor examples include general computing processors or specialized logic that implements the decoding techniques presented herein.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine-generated electrical, optical, or electromagnetic signal, that is generated to encode information for transmission to suitable receiver apparatus for execution by a computer. The computer readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results.

Only a few implementations and examples are described and other implementations, enhancements and variations can be made based on what is described and illustrated in this document.

What is claimed is:

1. A method for soft-in, soft-out (SISO) decoding implemented by an information processing system that comprises hardware, the method comprising:

accessing, at the information processing system, initial soft information on a series of data units, the data units being processed under a coding scheme, wherein the initial soft information comprises a plurality of confidence levels for each data unit;

using, at the information processing system, a cyclic graphical model to represent the coding scheme, wherein the cyclic graphical model comprises a plurality of variables, wherein conditional values for the variables in the graphical model are set over a total number of first conditions representing a total number of permutations of the plurality of variables;

obtaining, at the information processing system, cycle-free graphical models for a plurality of second conditions allowable by the coding scheme, wherein the number of obtained cycle-free graphical models is less than the total number of the first conditions; and generating, at the information processing system, soft-out decision information by using information comprising the obtained cycle-free graphical models and the initial soft information, wherein the soft-out decision information comprises revised confidence levels for each data unit.

2. The method of claim 1, wherein generating soft-out decision information further comprises running soft-in, soft-out message updates on each one of the obtained cycle-free graphical models to produce updated soft information for each one.

3. The method of claim 2, wherein generating soft-out decision information further comprises marginalizing the updated soft information from each one of the obtained cycle-free graphical models.

4. The method of claim 2, wherein generating soft-out decision information further comprises comparing the updated soft information from each one of the obtained cycle-free graphical models.

5. The method of claim 1, wherein the series of data units comprises a series of binary bits.

6. A method for soft-in, soft-out (SISO) decoding implemented by an information processing system that comprises hardware, the method comprising:

accessing, at the information processing system, initial soft information on a series of data units, the data units being processed under a coding scheme, wherein the initial soft information comprises a plurality of confidence levels for each data unit, wherein the coding scheme comprises an inner code and an outer code;

operating, at the information processing system, a decoding scheme that processes soft information, the decoding scheme comprises conditioning on a plurality of states associated with the coding scheme by using one or more constraints of the coding scheme to reduce a number of states considered by the decoding scheme;

using, at the information processing system, the decoding scheme to generate a plurality of updated soft information based on each conditioned state by at least using the initial soft information; and combining, at the information processing system, the plurality of updated soft information to produce soft-out decision information, wherein the soft-out decision information comprises revised confidence levels for each data unit, wherein combining the plurality of updated soft information comprises marginalizing the plurality of updated soft information, wherein the decoding scheme comprises a SISO decoding scheme for the inner code and a SISO decoding scheme for the outer code, and wherein the decoding scheme exchanges soft information updates between the SISO decoding scheme for the inner code and the SISO decoding scheme for the outer code.

7. The method of claim 6, wherein the outer code comprises an extended Hamming code, wherein the operated decoding scheme is based on a Reed-Muller code.

8. The method of claim 6, wherein the operated decoding scheme is based on a dual code of the outer code.

9. An information processing device comprising:

a demodulator configured to receive an encoded signal comprising a series of data units and to produce initial soft information relating to the series of data units, wherein the initial soft information comprises a plurality of confidence levels for each data unit, wherein the coding scheme comprises an inner code and an outer code; and a processing module, communicatively coupled with the demodulator, comprising hardware configured to perform operations comprising:

accessing the initial soft information on the series of data units, the data units being processed under a coding scheme, wherein the initial soft information comprises a plurality of confidence levels for each data unit;

operating a decoding scheme that processes soft information, the decoding scheme comprises conditioning on a plurality of states associated with the coding scheme by using one or more constraints of the coding scheme to reduce a number of states considered by the decoding scheme;

using the decoding scheme to generate a plurality of updated soft information based on each conditioned state by at least using the initial soft information; and combining the plurality of updated soft information to produce soft-out decision information, wherein the soft-out decision information comprises revised confidence levels for each data unit, wherein combining the plurality of updated soft information comprises marginalizing the plurality of updated soft information, wherein the decoding scheme comprises a soft-in, soft-out (SISO) decoding scheme for the inner code and a SISO decoding scheme for the outer code, and wherein the decoding scheme exchanges soft information updates between the SISO decoding scheme for the inner code and the SISO decoding scheme for the outer code.

10. The device of claim 9, wherein the outer code comprises an extended Hamming code, wherein the operated decoding scheme is based on a Reed-Muller code.

11. The device of claim 9, wherein the operated decoding scheme is based on a dual code of the outer code.

12. An information processing system comprising:

an encoder that encodes data using a first coding scheme to produce an encoded signal comprising a series of data units, wherein the first coding scheme comprises an inner code and a first outer code;

a demodulator configured to receive the encoded signal and to produce initial soft information relating to the series of data units, wherein the initial soft information comprises a plurality of confidence levels for each data unit; and a processing module, communicatively coupled with the demodulator, comprising hardware configured to perform operations comprising:

accessing the initial soft information on the series of data units;

operating a decoding scheme that processes soft information, the decoding scheme comprises conditioning on a plurality of states associated with a second coding scheme by using one or more constraints of the second coding scheme to reduce a number of states considered by the decoding scheme, wherein the second coding scheme comprises the inner code and a second outer code;

using the decoding scheme to generate a plurality of updated soft information based on each conditioned state by at least using the initial soft information; and combining the plurality of updated soft information to produce soft-out decision information, wherein the soft-out decision information comprises revised confidence levels for each data unit.

13. The system of claim 12, wherein the first outer code comprises an extended Hamming code, wherein the second outer code comprises a Reed-Muller code.

14. The system of claim 12, wherein the decoding scheme comprises a soft-in, soft-out (SISO) decoding scheme for the inner code and a SISO decoding scheme for the second outer code, wherein the decoding scheme exchanges soft information updates between the SISO decoding scheme for the inner code and the SISO decoding scheme for the second outer code.

15. The system of claim 12, wherein combining the plurality of updated soft information comprises marginalizing the plurality of updated soft information.

16. The system of claim 12, wherein the first outer code is a dual code of the second outer code.

17. The system of claim 12, further comprising:

a digital storage medium to store the encoded signal, wherein the encoded signal is written to and accessed from the digital storage medium.

18. The system of claim 12, further comprising:

a communication link communicatively coupled with the encoder and the demodulator, wherein the encoded signal is transmitted over and received from the communication link.

19. A computer system for soft-in, soft-out (SISO) decoding, comprising:

means for accessing initial soft information on a series of data units, the data units being processed under a coding scheme, wherein the initial soft information comprises a plurality of confidence levels for each data unit;

means for using a cyclic graphical model to represent the coding scheme, wherein the cyclic graphical model comprises a plurality of variables, wherein conditional values for the variables in the graphical model are set over a total number of first conditions representing a total number of permutations of the plurality of variables;

means for obtaining cycle-free graphical models for a plurality of second conditions allowable by the coding scheme, wherein number of obtained cycle-free graphical models is less than the total number of the first conditions; and means for generating soft-out decision information by using information comprising the obtained cycle-free graphical models and the initial soft information, wherein the soft-out decision information comprises revised confidence levels for each data unit.

20. The system of claim 19, wherein the means for generating soft-out decision information comprises means for running soft-in, soft-out message updates on each one of the obtained cycle-free graphical models to produce updated soft information for each one of the obtained cycle-free graphical models.

21. The system of claim 20, wherein the means for generating soft-out decision information comprises means for marginalizing the updated soft information from each one of the obtained cycle-free graphical models.

22. The system of claim 20, wherein the means for generating soft-out decision information comprises means for comparing the updated soft information from each one of the obtained cycle-free graphical models.

23. The system of claim 19, wherein the series of data units comprises a series of binary bits.

* * * * *